United States Patent
Nakajima et al.

(10) Patent No.: US 9,646,181 B2
(45) Date of Patent: May 9, 2017

(54) CARD READER

(71) Applicant: NIDEC SANKYO CORPORATION, Suwa-gun, Nagano (JP)

(72) Inventors: Shigeo Nakajima, Nagano (JP); Mamoru Mizawa, Nagano (JP)

(73) Assignee: NIDEC SANKYO CORPORATION, Nagano (JP)

(*) Notice: Subject to any disclaimer, the term of this patent is extended or adjusted under 35 U.S.C. 154(b) by 0 days.

(21) Appl. No.: 15/205,381

(22) Filed: Jul. 8, 2016

(65) Prior Publication Data
US 2017/0011237 A1    Jan. 12, 2017

(30) Foreign Application Priority Data

Jul. 8, 2015 (JP) ................................. 2015-137138

(51) Int. Cl.
| | |
|---|---|
| *G06K 7/08* | (2006.01) |
| *G06K 7/10* | (2006.01) |
| *G11B 7/0033* | (2006.01) |
| *H05K 1/14* | (2006.01) |
| *H05K 1/18* | (2006.01) |

(52) U.S. Cl.
CPC .............. *G06K 7/10* (2013.01); *G11B 7/0033* (2013.01); *H05K 1/14* (2013.01); *H05K 1/18* (2013.01)

(58) Field of Classification Search
USPC ........................................ 235/454, 449, 451
See application file for complete search history.

(56) References Cited

U.S. PATENT DOCUMENTS

| | | | | |
|---|---|---|---|---|
| 7,556,195 B2* | 7/2009 | Ishii | ...................... | G06K 13/08 235/435 |
| 2004/0084528 A1* | 5/2004 | Moriya | .................. | G06K 1/125 235/449 |
| 2006/0283955 A1* | 12/2006 | Riester | ................. | G06K 7/0021 235/475 |
| 2011/0278359 A1* | 11/2011 | Kasai | ..................... | G06K 7/084 235/449 |
| 2013/0026218 A1* | 1/2013 | Miller | .................. | G06K 7/0004 235/375 |

FOREIGN PATENT DOCUMENTS

JP        2012203950 A    10/2012

* cited by examiner

*Primary Examiner* — Ahshik Kim
(74) *Attorney, Agent, or Firm* — Cantor Colburn LLP

(57) ABSTRACT

A card reader may include a recording and reproducing means to perform reading of data or writing of data, a first cable configured to transmit a data signal outputted from the recording and reproducing means or a data signal inputted into the recording and reproducing means, a circuit board in a flat plate shape for controlling the card reader, a connector mounted on the circuit board and connected with one end side of the first cable, and a second cable connected with the circuit board and configured to transmit a control signal for controlling the card reader. A width of the second cable is wider than a width of the first cable, and the second cable is connected with the circuit board so as to cover a connected portion of the first cable with the connector.

18 Claims, 2 Drawing Sheets

CARD READER

CROSS REFERENCE TO RELATED APPLICATION

The present invention claims priority under 35 U.S.C. §119 to Japanese Application No. 2015-137138 filed Jul. 8, 2015, the entire content of which is incorporated herein by reference.

FIELD OF THE INVENTION

At least an embodiment of the present invention may relate to a card reader structured to perform reading of data recorded in a card and/or writing of data to a card.

BACKGROUND

Conventionally, a card reader structured to perform reading of data recorded in a card and/or writing of data to a card has been known (see, for example, Japanese Patent Laid-Open No. 2012-203950). The card reader described in the Patent Literature includes a magnetic head structured to perform reading of magnetic data recorded in a card. A flexible cable is connected with the magnetic head. The flexible cable includes a data signal layer and disconnection detection signal layers for covering both faces of the data signal layer through an insulating layer. The data signal layer is formed with a data signal pattern for transmitting a data signal of magnetic data read by the magnetic head, and the disconnection detection signal layer is formed with a disconnection detection signal pattern for detecting its own disconnection.

In the card reader described in the above-mentioned Patent Literature, the data signal layer is covered by the disconnection detection signal layer and thus, when a criminal attaches a signal line to the data signal pattern for illegally acquiring a data signal, the disconnection detection signal pattern is broken and disconnected. Therefore, in the card reader, it can be detected that a criminal act has been performed by using the disconnection detection signal pattern and, as a result, the illegal acquisition of magnetic data by a criminal can be prevented.

In the card reader described in the above-mentioned Patent Literature, the disconnection detection signal layer is formed in a flexible cable configured to transmit a data signal of magnetic data read by the magnetic head and thus, as described above, illegal acquisition of the data signal by a criminal can be prevented. However, in the card reader, the disconnection detection signal layer is formed in a flexible cable for transmitting a data signal of magnetic data and thus a structure of the flexible cable is complicated and cost of the flexible cable is expensive.

SUMMARY

In view of the problem described above, at least an embodiment of the present invention may advantageously provide a card reader which is capable of restraining illegal acquisition of a data signal by a criminal while reducing a cost of a cable configured to transmit a data signal outputted from a recording and reproducing means structured to perform reading and/or writing of data to a card and a data signal inputted into the recording and reproducing means.

According to at least an embodiment of the present invention, there may be provided a card reader including a recording and reproducing means structured to perform at least one of reading of data recorded in a card and writing of data to the card, a first cable configured to transmit at least one of a data signal which is outputted from the recording and reproducing means and a data signal which is inputted into the recording and reproducing means, a circuit board in a flat plate shape for controlling the card reader, a connector which is mounted on the circuit board and is connected with one end side of the first cable, and a second cable which is connected with the circuit board and is configured to transmit a control signal for controlling the card reader. A width of the second cable is set to be wider than a width of the first cable, and the second cable is connected with the circuit board so as to cover a connected portion of the first cable with the connector.

In the card reader in at least an embodiment of the present invention, a width of the second cable is set to be wider than a width of the first cable configured to transmit a data signal outputted from the recording and reproducing means and a data signal inputted into the recording and reproducing means and a connected portion of the first cable with the connector where a data signal is illegally acquired most easily is covered by the second cable having a wide width. Therefore, in at least an embodiment of the present invention, even when the disconnection detection signal layer described in the above-mentioned Patent Literature is not formed in the first cable, illegal acquisition of a data signal by a criminal is restrained. Accordingly, in at least an embodiment of the present invention, while reducing cost of the first cable, illegal acquisition of a data signal by a criminal is restrained. Further, in at least an embodiment of the present invention, a connected portion of the first cable with the connector is covered by the second cable configured to transmit a control signal for controlling the card reader and thus another member for covering the connected portion of the first cable with the connector is not required to provide separately. Therefore, according to at least an embodiment of the present invention, the structure of the card reader can be simplified.

In at least an embodiment of the present invention, the second cable covers the connected portion of the first cable with the connector and also covers at least a part of the first cable. According to this structure, illegal acquisition of a data signal by a criminal can be effectively restrained.

In at least an embodiment of the present invention, the recording and reproducing means is a magnetic head and the other end of the first cable is connected with the magnetic head. In this case, illegal acquisition of a data signal of magnetic data outputted from the magnetic head and a data signal of magnetic data inputted into the magnetic head is restrained while reducing the cost of the first cable.

In at least an embodiment of the present invention, the card reader includes a second circuit board in a flat plate shape for controlling the card reader, and the second cable electrically connects the circuit board with the second circuit board. In this case, for example, the card reader includes a card passage where the card is passed, and a card detection mechanism structured to detect the card passing along the card passage. The card detection mechanism is an optical type sensor having a light emitting part and a light receiving part which are disposed so as to interpose the card passage, and the second circuit board is mounted with the light emitting part or the light receiving part. In this case, specifically, it may be structured that the second circuit board is disposed on a second direction side with respect to the card passage, and a control signal for the light emitting part or the light receiving part provided on the second circuit board is transmitted from the circuit board through the second cable extended along a side face of a main body frame structuring the card passage. In this case, the connected portion of the first cable with the connector is covered by the second circuit board which electrically connects the second circuit board and the circuit board for controlling the card reader and thus another member for covering the connected portion of the first cable with the connector is not required to provide separately. Therefore, the structure of the card reader can be simplified.

In at least an embodiment of the present invention, the card reader includes a card passage where the card is passed, and the recording and reproducing means is a magnetic head. When one side in a thickness direction of the card passing along the card passage is referred to as a first direction, and an opposite direction is referred to as a second direction, the circuit board is disposed on a first direction side with respect to the card passage, the second circuit board is disposed on a second direction side with respect to the card passage, and the magnetic head is disposed so as to face the card passage from the second direction side. For example, in this case, the first cable is extended along a side face of a main body frame structuring the card passage and is connected with the connector. Further, in this case, the connected portion of the first cable with the connector can be covered by the second cable extended from the second direction side of the card passage toward the first direction side. Specifically, it may be structured that the first cable is extended along the side face of the main body frame structuring the card passage and is connected with the connector, a control signal for the light emitting part or the light receiving part provided on the second circuit board is transmitted from the circuit board through the second cable extended along the side face of the main body frame structuring the card passage, and the second cable is provided on an outer side relative to the first cable extended along the side face of the main body frame.

In at least an embodiment of the present invention, the card reader includes a card passage where the card is passed, and a second connector which is mounted on the circuit board and is connected with one end side of the second cable. When one side in a thickness direction of the card passing along the card passage is referred to as a first direction, and an opposite direction is referred to as a second direction, the circuit board is disposed on a first direction side with respect to the card passage so that a thickness direction of the circuit board and a thickness direction of the card passing along the card passage are coincided with each other, the connector is mounted on a face on a second direction side of the circuit board, and the second connector is mounted on a face on the first direction side of the circuit board. The connected portion of the first cable with the connector is covered by the circuit board from the first direction side and is covered by the second cable from one side in a width direction of the card passing along the card passage. According to this structure, the connected portion of the first cable with the connector can be surely covered by the circuit board and the second cable. Therefore, illegal acquisition of a data signal by a criminal is restrained effectively.

Further, in this case, it is preferable that the second cable covers at least a part of the first cable from the one side in the width direction of the card passing along the card passage. According to this structure, illegal acquisition of a data signal by a criminal is further effectively restrained.

In at least an embodiment of the present invention, the card reader includes a second connector which is mounted on the circuit board and is connected with one end side of the second cable, the connector and the second connector are mounted on a face on the first direction side of the circuit board and, when the one end side of the second cable is connected with the second connector, the connector is entirely covered by the second cable. Also in this case, the connected portion of the first cable with the connector can be covered surely by the second cable. Further, it may be structured that the first cable is a shielding wire having a conducting wire with a coating and a thin conducting wire or metallic foil covering around the conducting wire, and the second cable is one of a flexible flat cable and a flexible printed circuit board.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF EMBODIMENTS

Embodiments of the present invention will be described below with reference to the accompanying drawings.

(Structure of Card Reader)

Figure 1:
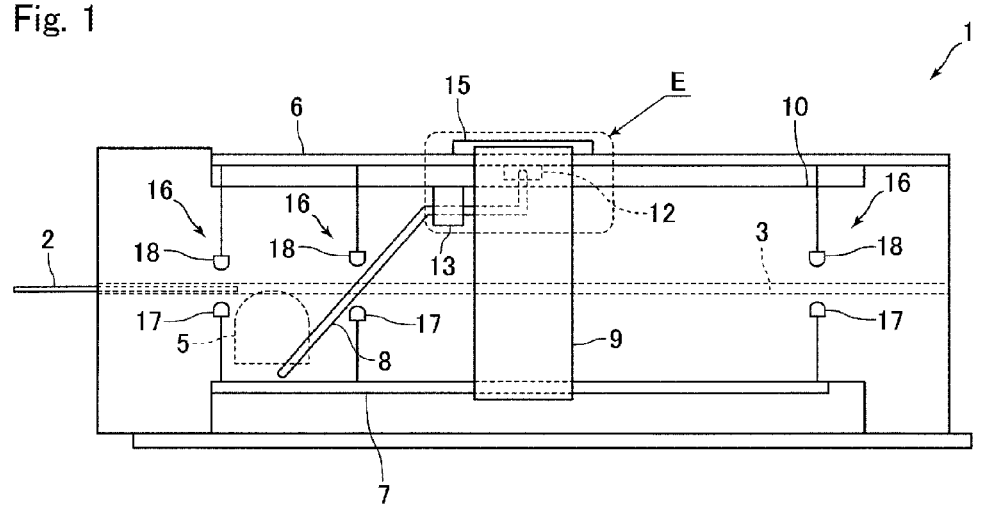
FIG. 1 is a schematic side view showing a card reader in accordance with an embodiment of the present invention.
Figure 1:
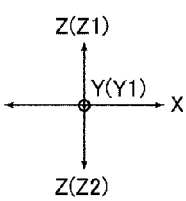
Figure 2:
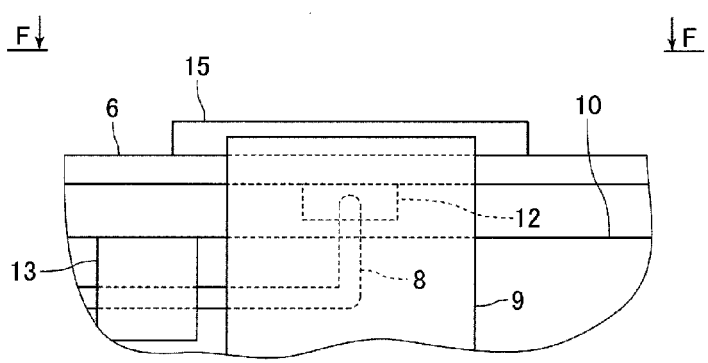
FIG. 2 is an enlarged view showing the "E" part in FIG. 1.
Figure 2:
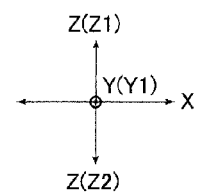
Figure 3:
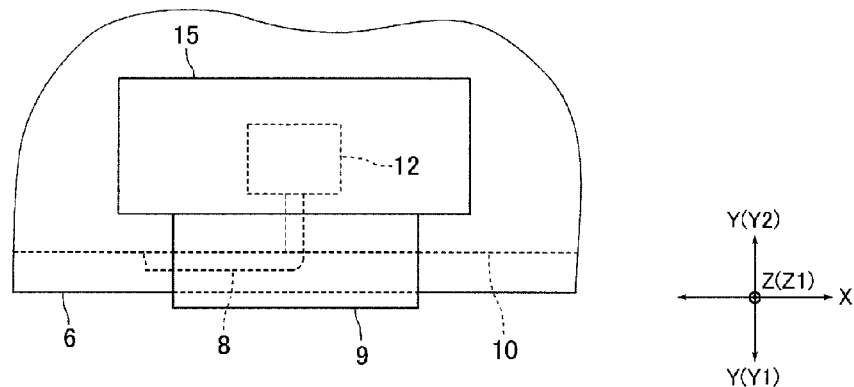
FIG. 3 is a view showing a circuit board, a first cable, a second cable, a connector, a second connector and the like which are viewed in the "F-F" direction in FIG. 2.

FIG. 1 is a schematic side view showing a card reader 1 in accordance with an embodiment of the present invention. FIG. 2 is an enlarged side view showing the "E" part in FIG. 1. FIG. 3 is a top view showing a circuit board 6, cables 8 and 9, connectors 12 and 15 and the like which are viewed in the "F-F" direction in FIG. 2.

A card reader 1 in this embodiment is a device structured to perform at least one of reading of data recorded in a card 2 and writing of data to a card 2 and, for example, is mounted and used in a predetermined host apparatus such as an ATM. An inside of the card reader 1 is formed with a card passage 3 where a card 2 inserted from a card insertion port is passed. The card reader 1 in this embodiment includes a card conveying mechanism structured to convey a card 2 along the card passage 3. The card passage 3 is a card conveying passage where a card 2 is conveyed.

A card 2 is, for example, a substantially rectangular-shaped card made of vinyl chloride whose thickness is about 0.7-0.8 mm. The card 2 is formed with a magnetic stripe in which magnetic data are recorded. An IC chip may be incorporated into the card 2. Further, a card 2 may be a PET (polyethylene terephthalate) card whose thickness is about 0.18-0.36 mm or may be a paper card having a predetermined thickness.

As shown in FIG. 1, a card 2 passing along the card passage 3 is moved in an "X" direction. A "Z" direction perpendicular to the "X" direction is a thickness direction of a card 2 passing along the card passage 3, and a "Y" direction perpendicular to the "Z" direction and the "X" direction is a width direction of the card 2 passing along the card passage 3. In the following descriptions, the "X" direction is referred to as a front and rear direction, the "Y" direction is referred to as a right and left direction, and the "Z" direction is referred to as an upper and lower direction. Further, the "Y1" direction in FIG. 3 which is one side in the width direction of a card 2 is referred to as a "right" direction, and the "Y2" direction in FIG. 3 which is its opposite direction (the other side in the width direction of the card 2) is referred to as a "left" direction. Further, the "Z1" direction in FIG. 1 which is one side in a thickness direction of a card 2 is referred to as an "upper" direction, and the "Z2" direction in FIG. 1 which is its opposite direction (the other side in the thickness direction of the card 2) is referred to as a "lower" direction. In this embodiment, the upper direction ("Z1" direction) is a first direction and the lower direction ("Z2" direction) is a second direction.

The card reader 1 includes a magnetic head 5 as a recording and reproducing means structured to perform at least one of reading of magnetic data recorded in a card 2 and writing of magnetic data to a card 2. The magnetic head 5 is disposed so as to face the card passage 3 from a lower side. Specifically, the magnetic head 5 is disposed so that a magnetic gap of the magnetic head 5 faces the card passage 3 from a lower side.

The card reader 1 also includes a circuit board 6 provided for controlling the card reader 1, a circuit board 7 as a second circuit board provided for controlling the card reader 1, a cable 8 as a first cable whose one end side is connected with the magnetic head 5 and which is configured to transmit at least one of a data signal of magnetic data outputted from the magnetic head 5 and a data signal of magnetic data inputted into the magnetic head 5, and a cable 9 as a second cable which is connected with the circuit board 6 for transmitting a control signal for controlling the card reader 1.

The circuit boards 6 and 7 are rigid circuit boards such as a glass epoxy substrate and are formed in a substantially rectangular flat plate shape. The circuit board 6 is fixed to a main body frame 10 of the card reader 1 so that a thickness direction of the circuit board 6 and the upper and lower direction are coincided with each other, in other words, so as to be parallel to the card passage 3. Further, the circuit board 6 is disposed in an upper end side portion of the card reader 1 and is disposed on an upper side relative to the card passage 3. The circuit board 7 is fixed to the main body frame 10 so that a thickness direction of the circuit board 7 and the upper and lower direction are coincided with each other. The circuit board 7 is disposed on a lower side relative to the card passage 3.

The circuit board 6 is a main circuit board for controlling the card reader 1. The circuit board 6 is mounted with main circuits such as a processing circuit of magnetic data, a drive circuit for a motor structuring the card conveying mechanism. Further, the card reader 1 includes a card detection mechanism 16 structured to detect a card 2 passing along the card passage 3. The card detection mechanism 16 is an optical type sensor having a light emitting part 17 and a light receiving part 18 which are oppositely disposed to each other so as to interpose the card passage 3 in the upper and lower direction. The light receiving parts 18 are mounted on the circuit board 6. The circuit board 7 is a sensor circuit board on which the light emitting parts 17 are mounted. In accordance with an embodiment of the present invention, it may be structured that the light emitting parts 17 are mounted on the circuit board 6 and the light receiving parts 18 are mounted on the circuit board 7. Further, when a card 2 is a non-contact type IC card, an antenna for communication and a control circuit for the antenna may be mounted on the circuit board 7. In other words, in a case that an antenna for communication is used as a recording and reproducing means, the antenna for communication is provided on an opposite side (lower side) to the circuit board 6 that is a main circuit board so as to interpose the card passage 3.

The cable 8 is, for example, a shielding wire provided with a conducting wire with a coating and a thin conducting wire or metallic foil covering around the conducting wire. The magnetic head 5 and the circuit board 6 are electrically connected with each other through the cable 8. One end side of the cable 8 is connected with a connector 12 which is mounted on the circuit board 6. Specifically, a male connector is attached to one end of the cable 8 and the male connector is inserted into the connector 12 which is a female connector. The connector 12 is mounted on an under face on the right end side of the circuit board 6 at a position on an inner side (left side) with respect to a right side face of the main body frame 10 and the entire connector 12 is covered by the circuit board 6 from an upper side. Further, a connected portion of the cable 8 with the connector 12 is covered by the circuit board 6 from an upper side. Specifically, the entire connected part of the cable 8 with the connector 12 is covered by the circuit board 6 from an upper side. Further, an upper end side of the cable 8 is covered by the circuit board 6 from an upper side. In other words, an end face on the right end side of the circuit board 6 is protruded to the right side relative to the right side face of the main body frame 10. The other end of the cable 8 is connected with the magnetic head 5. Specifically, the other end of the cable 8 is connected with terminals of the magnetic head 5 in an inside of the main body frame 10.

The cable 8 is led around and extended from a lower end side of the card reader 1 where the magnetic head 5 is disposed toward an upper end side of the card reader 1 where the circuit board 6 is disposed. Further, the cable 8 is led around on an outer side of the main body frame 10 so as to be extended along the right side face of the main body frame 10. In other words, the cable 8 with which its other end is connected with the magnetic head 5 disposed in an inside of the main body frame 10 is extended from a lower end side of the main body frame 10 to the right side so as to avoid the card passage 3 and then extended to an upper direction along the right side face (outer side of a side face forming the card passage 3, in other words, outer side face) of the main body frame 10 and then connected with the connector 12 from the right side. A portion on an upper end side of the cable 8 is held by a clamp member 13 which is attached to the main body frame 10.

The cable 9 is a flexible flat cable (FFC) or a flexible printed circuit board (FPC) and is formed in a long and thin strip shape. A width of the cable 9 is set to be wider than a width of the cable 8. Further, the width of the cable 9 is wider than a width (width in the front and rear direction) of the connector 12. The cable 9 electrically connects the circuit board 6 with the circuit board 7 and transmits a control signal for the light emitting parts 17 of the card detection mechanism 16 to the circuit board 7 from the circuit board 6.

One end side of the cable 9 is connected with a connector 15 which is mounted on the circuit board 6. Specifically, one end of the cable 9 is directly inserted into the connector 15. Further, the other end of the cable 9 is connected with the circuit board 7 directly or through a connector. The connector 15 is mounted on an upper face on a right end side of the circuit board 6. Specifically, the connector 15 is, as shown in FIG. 3, mounted on the upper face of the circuit board 6 so as to be overlapped with the connector 12 in the upper and lower direction. When viewed in the upper and lower direction, the connector 15 is larger than the connector 12 and an outward form of the connector 12 is accommodated within an outward form of the connector 15. The connector 15 in this embodiment is a second connector.

The cable 9 is led around and extended from a lower end side of the card reader 1 where the circuit board 7 is disposed toward an upper end side of the card reader 1 where the circuit board 6 is disposed. Further, the cable 9 is led around on an outer side of the main body frame 10 so as to be extended along the right side face (specifically, outer side of the right side face, in other words, outer side face) of the main body frame 10. In other words, the cable 9 whose the other end is connected with the circuit board 7 is extended from a lower end side of the main body frame 10 to the right side and then extended upward along the right side face of the main body frame 10 and then connected with the connector 15 from the right side.

As shown in FIG. 2, the cable 9 covers a connected portion of the cable 8 with the connector 12 from the right side. In other words, the cable 9 is extended on an outer side relative to the cable 8 along the right side face of the main body frame 10 and is connected with the circuit board 6 through the connector 15 so as to cover the connected portion of the cable 8 with the connector 12 from the right side. In this embodiment, the cable 9 covers the entire connected portion of the cable 8 with the connector 12 from the right side. Further, the cable 9 covers the entire connector 12 from the right side and covers a portion on an upper end side of the cable 8 from the right side.

(Principal Effects in this Embodiment)

As described above, in this embodiment, a connected portion of the connector 12 with the cable 8 configured to transmit a data signal of magnetic data outputted from the magnetic head 5 and a data signal of magnetic data inputted into the magnetic head 5 is covered by the circuit board 6 from an upper side and covered by the cable 9 whose width is wider than the cable 8 from the right side. In other words, according to this embodiment, a connected portion of the cable 8 with the connector 12 where a data signal of magnetic data is illegally acquired most easily is covered by the circuit board 6 and the cable 9. Therefore, in this embodiment, even when the disconnection detection signal layer described in the above-mentioned Patent Literature is not formed in the cable 8, illegal acquisition of a data signal of magnetic data by a criminal is restrained. Accordingly, in this embodiment, while reducing cost of the cable 8, illegal acquisition of a data signal of magnetic data can be restrained.

In this embodiment, the cable 9 whose width is wider than the cable 8 covers a portion on an upper end side of the cable 8 from the right side and the circuit board 6 covers the upper end side of the cable 8 from the upper side and thus illegal acquisition of a data signal of magnetic data by a criminal is restrained effectively. Specifically, the cable 8 is a shielding wire and the cable 9 is a flexible flat cable or a flexible printed circuit board and thus the cable 9 covers both sides of the cable 8 over wide areas (wide widths). For example, a width of each of both sides of the cable 9 exceeding the cable 8 in the front and rear direction (see FIG. 2) may be set at least three times or more than a width of the cable 8. Further, the connector 12 is provided on an under face of the circuit board 6 which is attached so as to close the main body frame 10 from an upper side. Further, in this embodiment, a connected portion of the cable 8 with the connector 12 is covered by the cable 9, which is extended from a lower end side of the card reader 1 toward an upper end side for electrically connecting the circuit board 6 with the circuit board 7, from the right side. Therefore, another member for covering the connected portion of the cable 8 with the connector 12 from the right side is not required to provide separately. Accordingly, in this embodiment, the structure of the card reader 1 can be simplified.

Other Embodiments

Although the present invention has been shown and described with reference to a specific embodiment, various changes and modifications will be apparent to those skilled in the art from the teachings herein.

Figure 4:
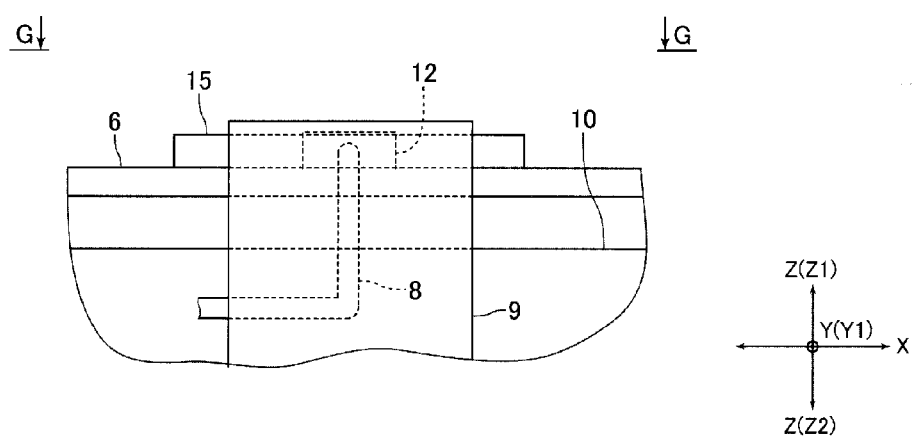
FIG. 4 is an explanatory enlarged view showing arrangement of connectors in accordance with another embodiment of the present invention.
Figure 5:
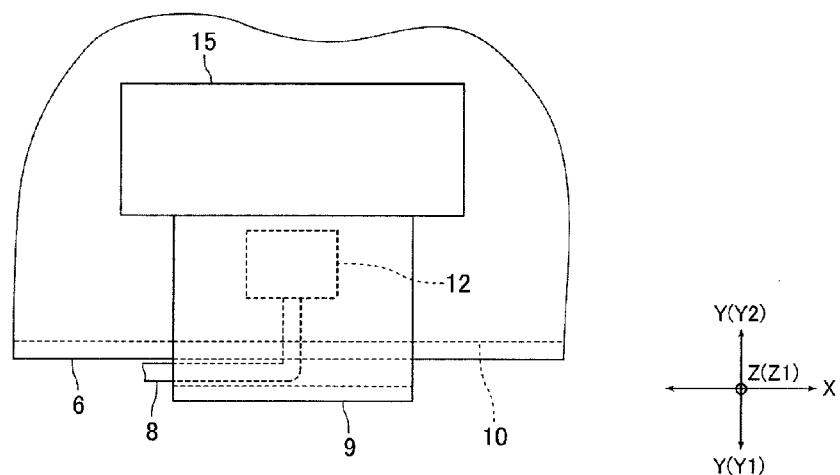
FIG. 5 is a view showing a circuit board, a first cable, a second cable, a connector, a second connector and the like which are viewed in the "G-G" direction in FIG. 4.

In the embodiment described above, the connector 12 is mounted on an under face of the circuit board 6. However, as shown in FIG. 4, the connector 12 may be mounted an upper face of the circuit board 6. In this case, as shown in FIG. 5, the connector 15 is mounted on an upper face of the circuit board 6 on a left side of the connector 12. Further, the cable 9 covers a connected portion of the cable 8 with the connector 12 from an upper side and a right side. In other words, the cable 9 is connected with the circuit board 6 through the connector 15 so as to cover the connected portion of the cable 8 with the connector 12 from an upper side and a right side. Specifically, the cable 9 covers the entire connected portion of the cable 8 with the connector 12 from an upper side and a right side. Further, the cable 9 covers the entire connector 12 from the upper side and the right side. Further, the connected portion of the cable 8 with the connector 12 is covered by the connector 15 from a left side and a portion on an upper end side of the cable 8 is covered by the cable 9 from the upper side and the right side.

Also in this case, the connected portion of the cable 8 with the connector 12 where a data signal of magnetic data is illegally acquired most easily is covered by the cable 9 from the upper side and the right side and is covered by the connector 15 from the left side. Therefore, even when the disconnection detection signal layer described in the above-mentioned Patent Literature is not formed in the cable 8, illegal acquisition of a data signal of magnetic data by a criminal is restrained. As a result, while reducing cost of the cable 8, illegal acquisition of a data signal of magnetic data is restrained. Further, another member for covering the connected portion of the cable 8 with the connector 12 from an upper side and a right side is not required to provide separately from the cable 9 and thus the structure of the card reader 1 can be simplified.

In the embodiment described above, the connector 15 is mounted on an upper face of the circuit board 6. However, the connector 15 may be mounted on an under face of the circuit board 6. In this case, the connector 15 is mounted on an under face of the circuit board 6 on a right side of the connector 12. Further, in this case, the cable 9 covers the connected portion of the cable 8 with the connector 12 from a right side.

In the embodiment described above, the cable 8 is, for example, a shielding wire, but the cable 8 may be an FFC or an FPC. Further, in the embodiment described above, a male connector which is inserted into the connector 12 is attached to one end of the cable 8. However, when the cable 8 is an FFC or an FPC, one end of the cable 8 may be directly inserted into the connector 12. Further, in the embodiment described above, one end of the cable 9 is connected with the circuit board 6 through the connector 15. However, one end of the cable 9 may be directly connected with the circuit board 6. Further, in the embodiment described above, the cable 9 is an FFC or an FPC. However, the cable 9 may be a bamboo blind type cable, which is formed so that a plurality of coated conducting wires arranged in a predetermined direction is fixed to each other in a tightly contacted state.

In the embodiment described above, the cable 8 electrically connects the magnetic head 5 with the circuit board 6. However, the present invention is not limited to this embodiment. For example, the cable 8 may electrically connects the card reader 1 with a host apparatus on which the card reader 1 is mounted, or may be a cable which electrically connects the card reader 1 with a peripheral device which is attached to the card reader 1. In this case, one end side of the cable 8 is connected with the connector 12 and the other end side of the cable 8 is connected with the host apparatus or the peripheral device. Also in this case, the cable 8 functions to transmit a data signal of magnetic data outputted from the magnetic head 5 and a data signal of magnetic data inputted into the magnetic head 5. Further, also in this case, a connected portion of the cable 8 with the connector 12 is covered by the circuit board 6 and the cable 9.

It may be structured that the card reader 1 includes IC contact points configured to contact with external connection terminals of an IC chip formed in a card 2 and the cable 8 electrically connects the IC contact points with the circuit board 6. In this case, the IC contact points are a recording and reproducing means structured to perform reading of data recorded in a card 2 and writing of data to the card 2, and the cable 8 transmits a data signal which is communicated with an IC chip of a card 2 through the IC contact points. Also in this case, a connected portion of the cable 8 with the connector 12 is covered by the circuit board 6 and the cable 9.

In the embodiment described above, the cable 8 is covered by the cable 9 which electrically connects the circuit board 6 with the circuit board 7. However, the cable 8 may be covered by a cable other than the cable 9. For example, the cable 8 may be covered by a cable which electrically connects the card reader 1 with a peripheral device which is attached to the card reader 1. Further, in the embodiment described above, a portion on an upper end side of the cable 8 is covered by the cable 9 but the entire cable 8 may be covered by the cable 9. Further, in the embodiment described above, the card reader 1 is a card conveyance type card reader including a card conveying mechanism. However, the card reader 1 may be a manual type card reader in which a card is manually operated by a user.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A card reader for use with a card, the card reader comprising:
    a recording and reproducing means structured to perform at least one of reading of data recorded in a card and writing of data to the card;
    a first cable configured to transmit at least one of a data signal which is outputted from the recording and reproducing means and a data signal which is inputted into the recording and reproducing means;
    a circuit board in a flat plate shape, the circuit board being structured to control the card reader;
    a connector mounted on the circuit board and connected with a first end of the first cable; and
    a second cable connected with the circuit board and configured to transmit a control signal for controlling the card reader;
    wherein a width of the second cable is wider than a width of the first cable, and the second cable is connected with the circuit board so as to cover a connected portion of the first cable with the connector.

2. The card reader according to claim 1, wherein the second cable covers the connected portion of the first cable with the connector and also covers at least a part of the first cable.

3. The card reader according to claim 2, wherein
    the recording and reproducing means comprises a magnetic head,
    a second end of the first cable is connected with the magnetic head, and
    the second cable electrically connects the circuit board with a second circuit board in a flat plate shape for controlling the card reader.

4. The card reader according to claim 3, further comprising a card passage where the card is passed,
    wherein when one side in a thickness direction of the card passing along the card passage is referred to as a first direction, and an opposite direction is referred to as a second direction,
    the circuit board is disposed on a first direction side with respect to the card passage, and the second circuit board is disposed on a second direction side with respect to the card passage,
    the magnetic head is disposed so as to face the card passage from the second direction side, and
    the first cable is extended along a side face of a main body frame structuring the card passage and is connected with the connector.

5. The card reader according to claim 4, further comprising a card detection mechanism structured to detect the card passing along the card passage,
    wherein the card detection mechanism comprises an optical type sensor comprising a light emitting part and a light receiving part which are disposed so as to interpose the card passage,
    wherein the second circuit board is mounted with the light emitting part or the light receiving part, and
    wherein a control signal for the light emitting part or the light receiving part provided on the second circuit board is transmitted from the circuit board through the second cable extended along the side face of the main body frame structuring the card passage.

6. The card reader according to claim 1, wherein
    the recording and reproducing means comprises a magnetic head, and
    a second end of the first cable is connected with the magnetic head.

7. The card reader according to claim 6, further comprising a second circuit board in a flat plate shape for controlling the card reader,
wherein the second cable electrically connects the circuit board with the second circuit board.

8. The card reader according to claim 7, further comprising:
a card passage where the card is passed; and
a card detection mechanism structured to detect the card passing along the card passage;
wherein the card detection mechanism comprises an optical type sensor comprising a light emitting part and a light receiving part which are disposed so as to interpose the card passage, and
wherein the second circuit board is mounted with the light emitting part or the light receiving part.

9. The card reader according to claim 8, wherein
when one side in a thickness direction of the card passing along the card passage is referred to as a first direction, and an opposite direction is referred to as a second direction,
the circuit board is disposed on a first direction side with respect to the card passage, and the second circuit board is disposed on a second direction side with respect to the card passage, and
a control signal for the light emitting part or the light receiving part provided on the second circuit board is transmitted from the circuit board through the second cable extended along a side face of a main body frame structuring the card passage.

10. The card reader according to claim 7, further comprising a card passage where the card is passed,
wherein the recording and reproducing means comprises magnetic head, and
wherein when one side in a thickness direction of the card passing along the card passage is referred to as a first direction, and an opposite direction is referred to as a second direction, the circuit board is disposed on a first direction side with respect to the card passage, the second circuit board is disposed on a second direction side with respect to the card passage, and the magnetic head is disposed so as to face the card passage from the second direction side.

11. The card reader according to claim 10, further comprising a card detection mechanism structured to detect the card passing along the card passage,
wherein the card detection mechanism comprises an optical type sensor comprising a light emitting part and a light receiving part which are disposed so as to interpose the card passage,
wherein the second circuit board is mounted with the light emitting part or the light receiving part,
wherein the first cable is extended along a side face of a main body frame structuring the card passage and is connected with the connector,
wherein a control signal for the light emitting part or the light receiving part provided on the second circuit board is transmitted from the circuit board through the second cable extended along the side face of the main body frame structuring the card passage, and
wherein the second cable is provided on an outer side relative to the first cable which is extended along the side face of the main body frame.

12. The card reader according to claim 11, further comprising a second connector which is mounted on the circuit board and is connected with one end side of the second cable,
wherein the connector and the second connector are mounted on a face on the first direction side of the circuit board, and
wherein when the one end side of the second cable is connected with the second connector, the connector is entirely covered by the second cable.

13. The card reader according to claim 1, further comprising:
a card passage where the card is passed; and
a second connector which is mounted on the circuit board and is connected with one end side of the second cable,
wherein when one side in a thickness direction of the card passing along the card passage is referred to as a first direction, and an opposite direction is referred to as a second direction,
the circuit board is disposed on a first direction side with respect to the card passage so that a thickness direction of the circuit board and a thickness direction of the card passing along the card passage are coincided with each other,
the connector is mounted on a face on a second direction side of the circuit board, and the second connector is mounted on a face on the first direction side of the circuit board, and
the connected portion of the first cable with the connector is covered by the circuit board from the first direction side and is covered by the second cable from one side in a width direction of the card passing along the card passage.

14. The card reader according to claim 13, wherein the second cable covers at least a part of the first cable from the one side in the width direction of the card passing along the card passage.

15. The card reader according to claim 13, wherein
the recording and reproducing means comprises a magnetic head,
a second end of the first cable is connected with the magnetic head, and
the second cable electrically connects the circuit board with a second circuit board in a flat plate shape for controlling the card reader.

16. The card reader according to claim 15, wherein
the second circuit board is disposed on a second direction side with respect to the card passage,
the magnetic head is disposed so as to face the card passage from the second direction side, and
the first cable is extended along a side face of a main body frame structuring the card passage and is connected with the connector.

17. The card reader according to claim 16, further comprising a card detection mechanism structured to detect the card passing along the card passage,
wherein the card detection mechanism comprises an optical type sensor comprising a light emitting part and a light receiving part which are disposed so as to interpose the card passage,
wherein the second circuit board is mounted with the light emitting part or the light receiving part, and
wherein a control signal for the light emitting part or the light receiving part provided on the second circuit board is transmitted from the circuit board through the second cable extended along the side face of the main body frame structuring the card passage.

18. The card reader according to claim 1, wherein
the first cable comprises a shielding wire comprising a conducting wire with a coating and a thin conducting wire or metallic foil covering around the conducting wire, and
the second cable comprises one of a flexible flat cable and a flexible printed circuit board.

* * * * *